US006781433B2

United States Patent
Mori (10) Patent No.: US 6,781,433 B2
(45) Date of Patent: Aug. 24, 2004

(54) CAPACITANCE ADJUSTING CIRCUIT (75) Inventor: Hiroyuki Mori, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 10/421,861

(22) Filed: Apr. 24, 2003

(65) Prior Publication Data

US 2004/0095209 A1 May 20, 2004

(30) Foreign Application Priority Data

Nov. 14, 2002 (JP) ....................................... 2002/330535

(51) Int. Cl.[7] .............................................. G06F 7/64
(52) U.S. Cl. ...................... 327/337; 327/552; 327/553; 327/554
(58) Field of Search ................................ 327/337, 552, 327/553, 554, 307

(56) References Cited

U.S. PATENT DOCUMENTS

| 4,791,379 A | * | 12/1988 | Hughes | 327/554 |
| 6,417,737 B1 | | 7/2002 | Moloudi et al. | 330/301 |
| 6,441,671 B1 | * | 8/2002 | Rastegar | 327/337 |
| 6,566,933 B1 | * | 5/2003 | Lye | 327/337 |
| 6,614,286 B1 | * | 9/2003 | Tang | 327/337 |
| 6,714,066 B2 | * | 3/2004 | Gorecki et al. | 327/553 |

FOREIGN PATENT DOCUMENTS

JP          05114835 A          5/1993

* cited by examiner

*Primary Examiner*—Tuan T. Lam
*Assistant Examiner*—Hiep Nguyen
(74) *Attorney, Agent, or Firm*—Volentine Francos, PLLC (57) ABSTRACT

A first operational amplifier receives a reference voltage at one input terminal, a first transistor is connected between a first power source line and the first operational amplifier, a second transistor is connected between the first power source line and the first operational amplifier, a resistor is connected between the first transistor and a second power source line, a first switch is connected to the second transistor, a variable capacitor connected between the first switch and the second power source line, a second switch is connected the variable capacitor and the second power source line, a second operational amplifier is connected to the variable capacitor and the reference voltage, a third switch is connected to the second transistor, a load is connected between the third switch and the second power source line, and a control circuit is connected to the first to third switches.

6 Claims, 7 Drawing Sheets

CAPACITANCE ADJUSTING CIRCUIT

BACKGROUND OF THE INVENTION

1. Field of the Invention

The present invention relates to a circuit for adjusting a variable capacitance. The invention can be used for adjusting the variable capacitance provided in a frequency filter, for example.

2. Description of the Related Art

For example, an RC filter is known as a frequency filter. The RC filter is disclosed in FIG. 6 of U.S. Pat. No. 6,417,737, for example. In the RC filter, a resister R and a capacitor C are connected in parallel between one input end of an operational amplifier and an output terminal. The cut-off frequency in the frequency filter having the construction can be calculated by:

$$Fc=1/(2\pi RC) \qquad (1)$$

In a semiconductor integrated circuit, the resister R and capacitor C contain polysilicon. However, when a resister contains polysilicon, variations of about ±10% may occur in resistance values of chips. Similarly, when a capacitor contains polysilicon, variations of about ±10% may occur in capacitance values of chips. Thus, the cut-off frequency Fc varies from 0.92 to 1.12 times of the designed value. In other words, variations of about ±20% may occur in cut-off frequencies Fc of chips.

Therefore, a frequency filter using a variable capacitor as the capacitor C has been already proposed. The frequency filter is disclosed in FIG. 41 of U.S. Pat. No. 6,417,737 and in FIG. 1 of JP-A-5-114835, for example.

Furthermore, a circuit for adjusting capacitance of the variable capacitor is disclosed in FIG. 39 of U.S. Pat. No. 6,417,737. By using the shown capacitance adjusting circuit, an optimum value of a capacitance set at the variable capacitor can be measured.

When a switch 193 is closed and a switch 194 is opened in the adjusting circuit disclosed in FIG. 39 of U.S. Pat. No. 6,417,737, charges flown from a pair of transistors 176 and 182 into a variable capacitor 188. The flowing charges are stored in the variable capacitor 188. A comparator 198 outputs a result of the comparison between a terminal voltage Vcap of the variable capacitor 188 and a reference voltage Vref. Then, the switch 193 is opened while the switch 194 is closed. Thus, the charges stored in the variable capacitor 188 are released to the ground.

Here, a parasitic capacitor is established between the gate and drain of the transistors 176 and 182. The parasitic capacitor stores a part of current flowing through the transistors 176 and 182. However, even when the switch 194 is closed, the charges stored in the parasitic capacitor are not discharged. This is because, when charges are released, the switch 193 is opened. The charges stored in the parasitic capacitor move to the variable capacitor 188 when the switch 193 is closed. The moving charges cause an error in terminal voltage Vcap of the variable capacitor 188.

Therefore, the capacitance adjusting circuit shown in FIG. 39 of U.S. Pat. No. 6,417,737 cannot have the sufficient precision.

SUMMARY OF THE INVENTION

A capacitance adjusting circuit according to the invention includes a first operational amplifier for inputting a reference voltage from one input terminal, a first transistor having one main electrode connected to a first power source line, the other main electrode connected to the other input terminal of the first operational amplifier and a control electrode connected to an output terminal of the first operational amplifier, a second transistor having one main electrode connected to the first power source line, and a control electrode connected to the output terminal of the first operational amplifier, a resistor having one end connected to the other main electrode of the first transistor and the other end connected to a second power source line, a first switch having one end connected to the other main electrode of the second transistor, a variable capacitor having one end connected to the other end of the first switch and the other end connected to the second power source line, a second switch having one end connected to the one end of the variable capacitor and the other end connected to the second power source line, a second operational amplifier having one input terminal connected to the one end of the variable capacitor and the other input terminal from which the reference voltage is input, a third switch having one end connected to the other main electrode of the second transistor, a load having one end connected to the other end of the third switch and the other end connected to the second power source line, and a control circuit for controlling the opening and closing of the first to third switches and for storing outputs of the second operational amplifier sequentially.

With this construction, by using the third switch and the load, charges stored in the parasitic capacitor between the other main electrode and the control electrode of the second transistor can be discharged to the second power source line.

BRIEF DESCRIPTION OF THE DRAWINGS

The invention will be more particularly described with reference to the accompanying drawings, in which.

DETAILED DESCRIPTION OF THE PREFERRED EMBODIMENTS

Specific examples of the invention will be described below with reference to drawings. The sizes, shapes and positional relationship of the components are only shown schematically enough to understand the invention therefrom. Furthermore, value requirements, which will be described below, are only examples.

In a specific example, a capacitance adjusting circuit and an RC filter circuit are provided on one semiconductor chip. A single capacitance adjusting circuit can adjust multiple identical RC filter circuits on one semiconductor chip.

Figure 1:
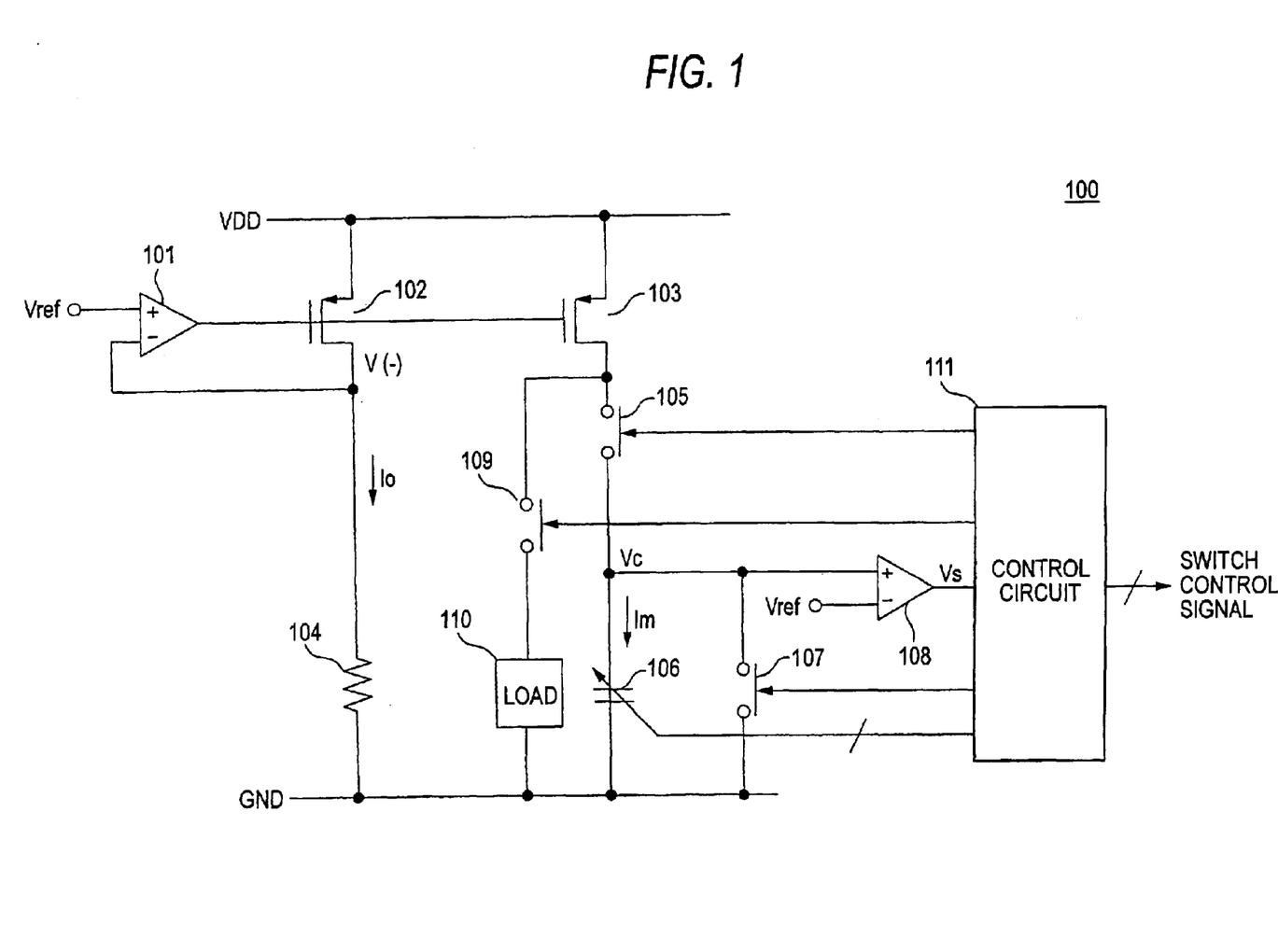
FIG. 1 is a circuit diagram showing a construction of a capacitance adjusting circuit according to the invention.

FIG. 1 is a circuit diagram showing a construction of the capacitance adjusting circuit according to the specific example. As shown in FIG. 1, a capacitance adjusting circuit 100 includes a first operational amplifier 101, a first n-type Metal Oxide Semiconductor (nMOS) transistor 102, a second nMOS transistor 103, a resister 104, a first switch 105, a variable capacitor 106, a second switch 107, a second operational amplifier 108, a third switch 109, a load 110 and a control circuit 111.

A reference voltage Vref is input from a positive input terminal of the operational amplifier 101.

The source of the nMOS transistor 102 is connected to a power source line VDD. The drain of the nMOS transistor 102 is connected to an inverse input terminal of the operational amplifier 101. The gate of the nMOS transistor 102 is connected to an output terminal of the operational amplifier 101.

The source of the nMOS transistor 103 is connected to the power source line VDD. The gate of the nMOS transistor 103 is connected to the output terminal of the operational amplifier 101.

One end of the resistor 104 is connected to the drain of the nMOS transistor 102. The other end of the resistor 104 is connected to a ground line GND. The resistance value of the resistor 104 is set to be equal to the resistance value R of an RC filter circuit, which will be described later.

One end of the variable capacitor 106 is connected to one end of the switch 105. The other end of the variable capacitor 106 is connected to the ground line GND.

One end of the switch 107 is connected to one end of the variable capacitor 106. The other end of the switch 107 is connected to the ground line GND.

The positive input terminal of the operational amplifier 108 is connected to one end of the variable capacitor 106. The reference voltage Vref is input from the inverse input terminal.

One end of the switch 109 is connected to the drain of the nMOS transistor 103.

One end of the load 110 is connected to the other end of the switch 109. The other end of the load 110 is connected to the ground line GND.

The control circuit 111 controls the opening and closing of the switches 105, 107 and 109. An output voltage Vs of the operational amplifier 108 is input to the control circuit 111. Furthermore, the control circuit 111 determines the optimal value for the capacitance. Then, the control circuit 111 adjusts the capacitance of the RC filter circuit based on the determination result.

Figure 2:
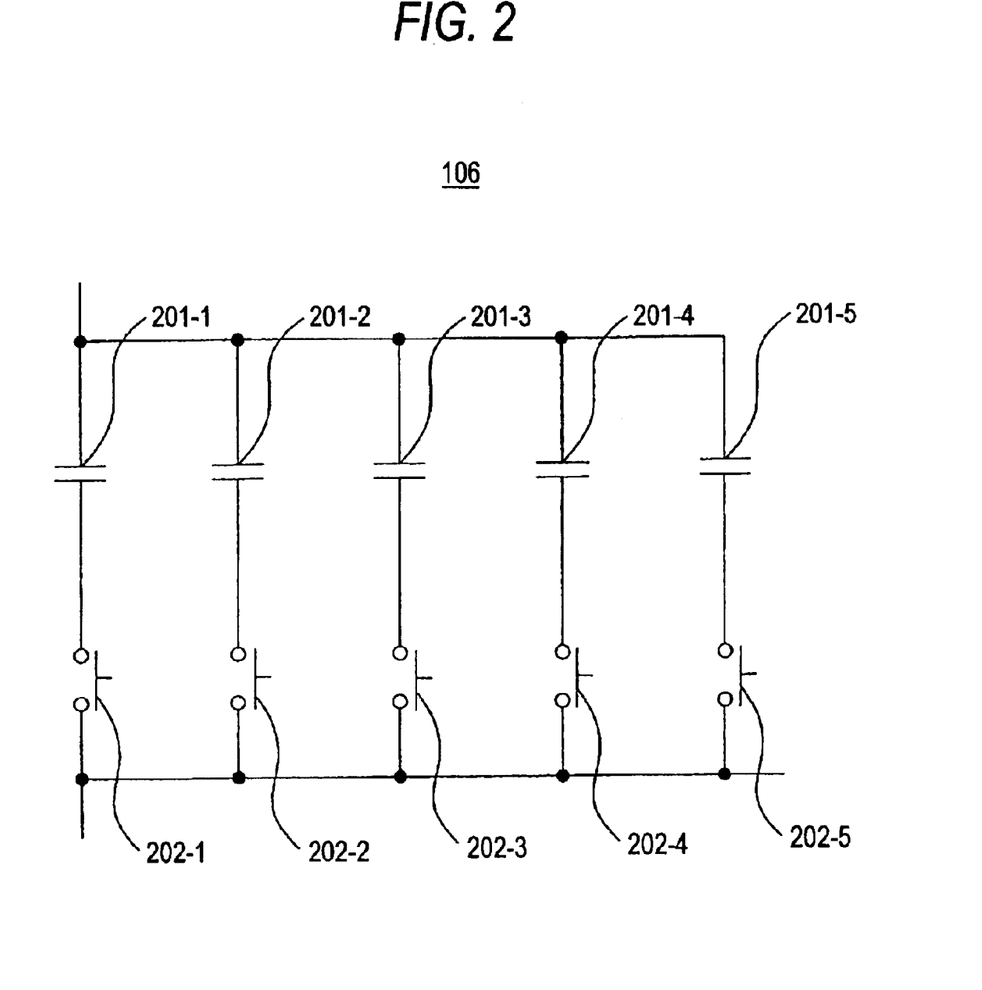
FIG. 2 is a circuit diagram showing a construction example of a variable capacitor shown in FIG. 1.

FIG. 2 is a circuit diagram showing a specific construction example of the variable capacitor 106.

AS shown in FIG. 2, the variable capacitor 106 includes five capacitors 201-1 to 201-5 and five switches 202-1 to 202-5. One ends of the capacitors 201-1 to 201-5 is connected to the switch 105. The other ends of the capacitors 201-1 to 201-5 are connected to the one ends of the switches 202-1 to 202-5. The other ends of the switches 202-1 to 202-5 are connected to the ground line GND (see FIG. 1).

In the example in FIG. 2, the five capacitors 201-1 to 201-5 are provided within the variable capacitor 106. However, the number of capacitors in the variable capacitor 106 and the capacitances are arbitrary. The capacitances of the capacitors may be the same or different. As described later, the number of capacitors provided in the variable capacitor 106 and the capacitances are equal to the number of capacitors (see FIG. 5) provided in the variable capacitor of the RC filter circuit and to the capacitances.

Figure 3A:
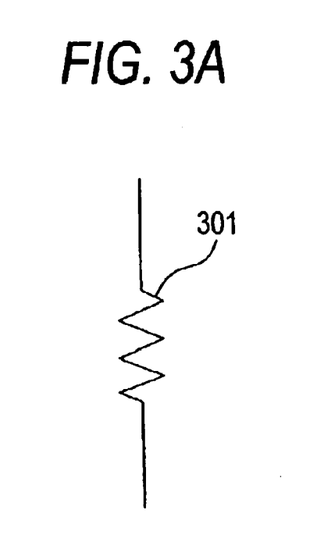
FIGS. 3A and 3B are circuit diagrams each showing a construction example of a load shown in FIG. 1.
Figure 3B:
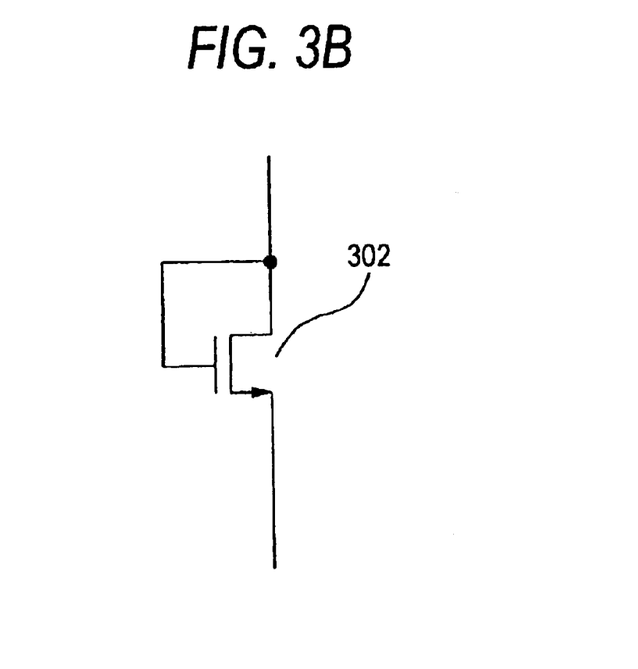

FIGS. 3A and 3B are circuit diagrams each showing an example of a specific construction of the load 110.

FIG. 3A is an example in which the load 110 is a resister 301. In FIG. 3A, one end of the resister 301 is connected to one end of the switch 109. The other end of the resister 301 is connected to the ground line GND.

FIG. 3B is an example in which the load 110 is a PMOS transistor 302 in a diode connection. One end of the PMOS transistor 302 is connected to one end of the switch 109. The other end of the pMOS transistor 302 is connected to the ground line GND. The load 110 may be a general diode.

The load 110 is provided in order to suppress excessive current flowing from the nMOS transistor 103 to the ground line GND. Therefore, the load 110 may be any element, which can accomplish the purpose.

Figure 4:
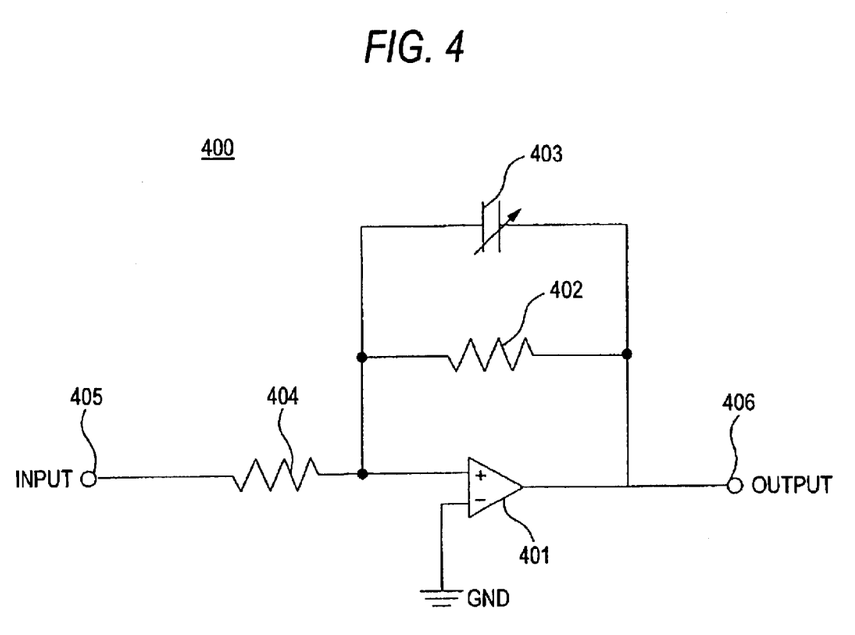
FIG. 4 is a circuit diagram showing a construction of an RC filter circuit according to a specific example of the invention.

FIG. 4 is a circuit diagram showing a construction example of the RC filter circuit. As described later, the cut-off frequency Fc of an RC filter circuit 400 is adjusted by the capacitance adjusting circuit 100.

As shown in FIG. 4, the RC filter circuit 400 includes an operational amplifier 401, resisters 402 and 404- and a variable capacitor 403.

The positive input terminal of the operational amplifier 401 is connected to a signal input terminal 405 through the resister 404. The inverse input terminal of the operational amplifier 401 is connected to the ground line GND. Furthermore, the output terminal of the operational amplifier 401 is connected to a signal output terminal 406. The resister 402 and the variable capacitor 403 are connected in parallel between the output terminal and positive input terminal of the operational amplifier 401.

With this construction, the cut-off frequency Fc as expressed by EQ 1 can be obtained.

Figure 5:
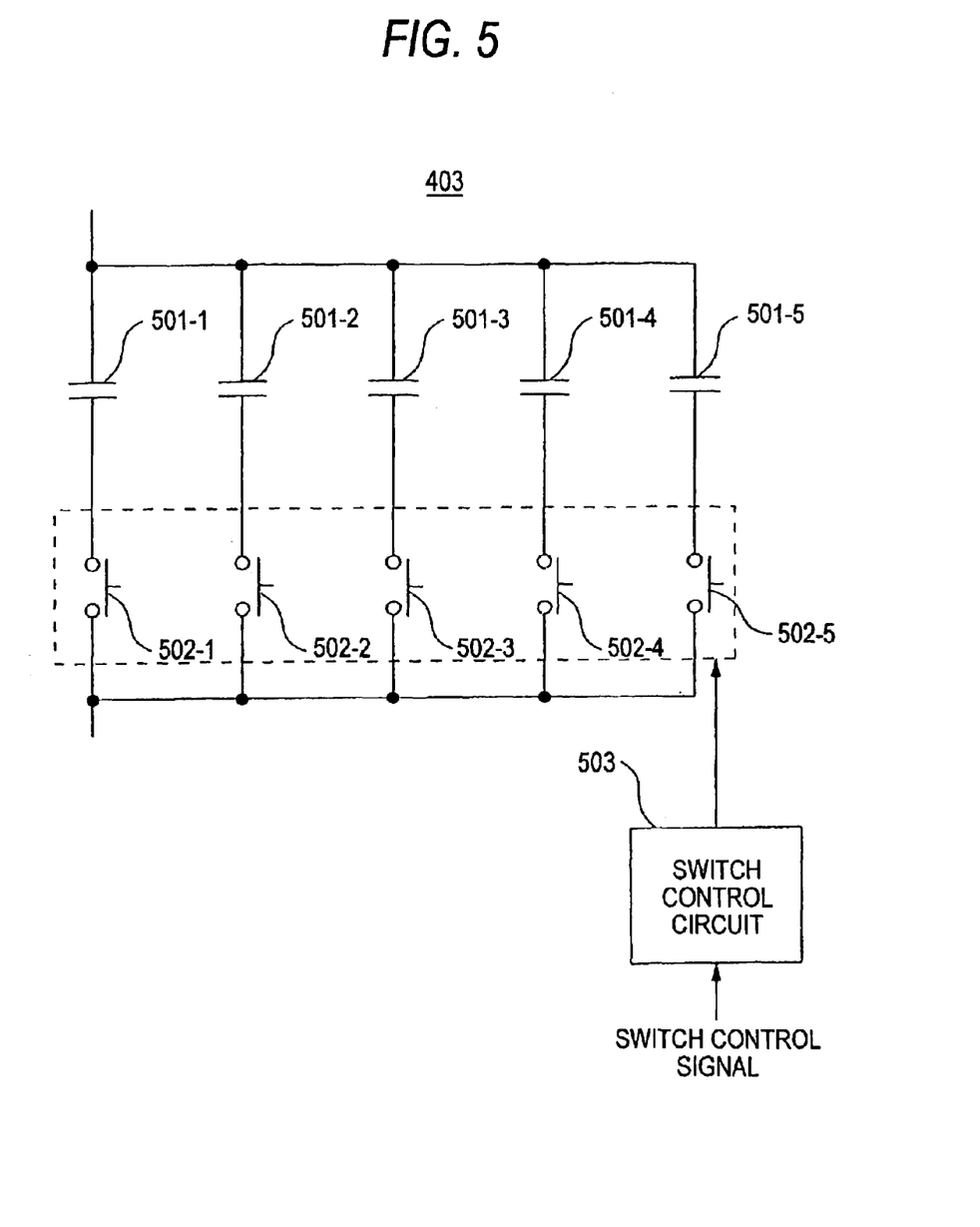
FIG. 5 is a circuit diagram showing a construction example of a variable capacitor shown in FIG. 4.

FIG. 5 is a circuit diagram showing an example of a specific construction of the variable capacitor 403.

As shown in FIG. 5, the variable capacitor 403 includes five capacitors 501-1 to 501-5, five switches 502-1 to 505-5, and a switch control circuit 503. One ends of the capacitors 501-1 to 501-5 are connected to the output terminal of the operational amplifier 401 (see FIG. 4). The other ends of the capacitors 501-1 to 501-5 are connected to one ends of the switches 502-1 to 502-5. The other ends of the switches 502-1 to 502-5 are connected to the positive input terminal of the operational amplifier 401. The switch control circuit 503 controls the opening and closing of the switches 502-1 to 502-5 based on the switch control signal input from the control circuit 111 (see FIG. 1).

As described above, when production variations in resistance values and capacitances of the RC filter circuit are ±10%, the production variations in cut-off frequencies Fc are ±20%. In this specific example, the capacitance of the variable capacitor 403 is adjusted so that the cut-off frequency Fc of the RC filter circuit 400 can be adjusted. Therefore, the variable capacitor 403 can desirably achieve the change of about ±20% highly precisely with respect to the designed value of the capacitance. In other words, the number of the capacitors (capacitors 502-1 to 502-5 in the example in FIG. 5) within the variable capacitor 403 and the capacitances should be determined so as to achieve the change of about ±20% highly precisely.

Next, the principle for adjusting the cut-off frequency Fc of the frequency filter circuit 400 by using the capacitance adjusting circuit 100 will be described with reference to FIGS. 6 and 7.

Figure 6:
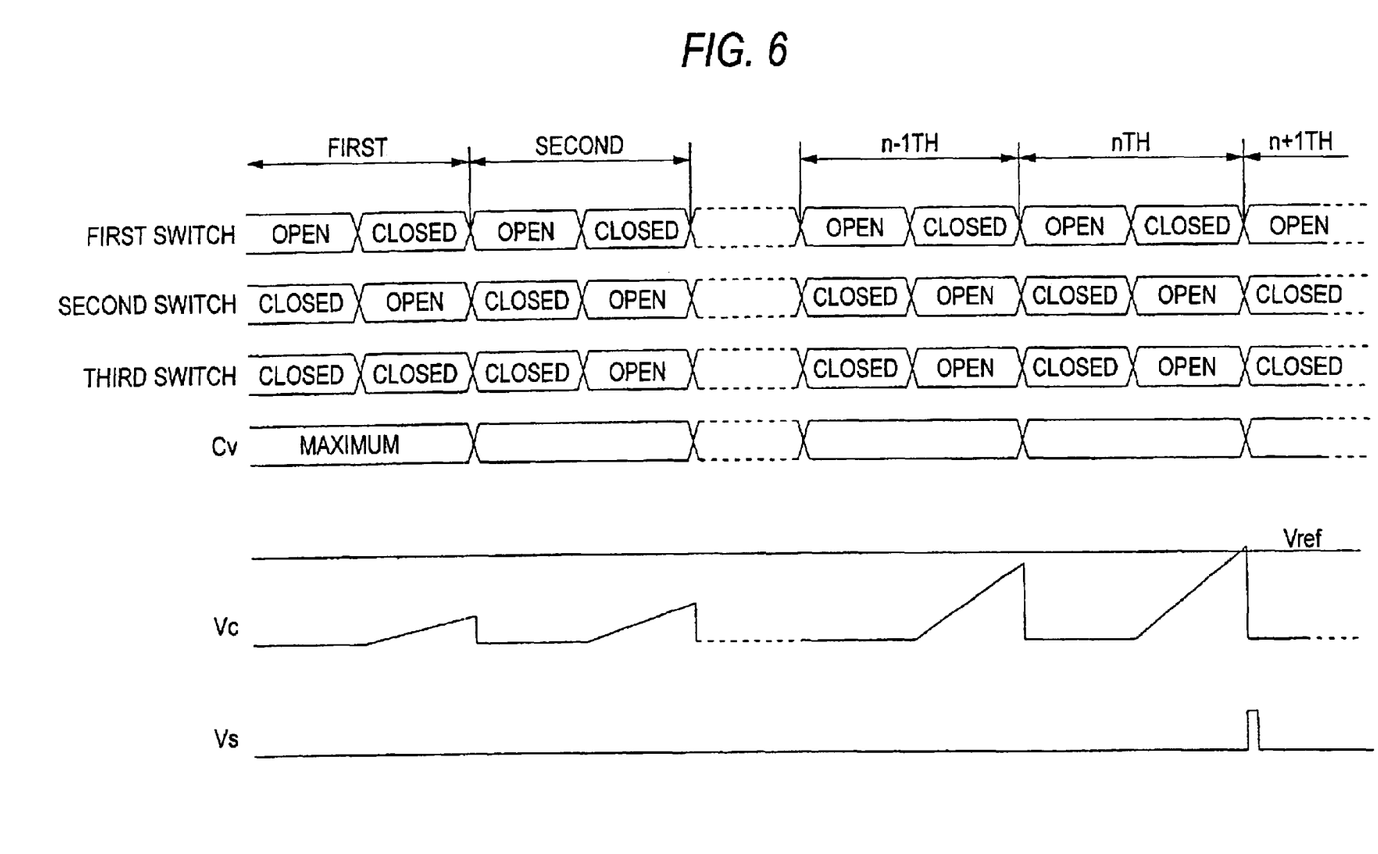
FIG. 6 is a timing chart showing an operation of the capacitance adjusting circuit shown in FIG. 1.

FIG. 6 is a timing chart for describing an operation of the capacitance adjusting circuit 100.

First of all, the power source voltage is applied to the power source line VDD. Furthermore, the reference voltage Vref is applied to the positive input terminal of the operational amplifier 101 and the inverse input terminal of the operational amplifier 108. Here, the voltage V(−) of the inverse input terminal of the operational amplifier 101 is zero volt. This is because the inverse input terminal of the operational amplifier. 101 is communicated with the ground line GND through the resister 104 and because the transistor 102 is off.

The voltage in accordance with the potential difference between the input terminals is output from the operational amplifier 101. Thus, the nMOS transistors 102 and 103 are turned on. Since the transistor 102 is turned on, current flows through the resister 104. Due to the voltage drop of the resister 104, the voltage V(−) raises. Therefore, the potential difference between the input terminals of the operational amplifier 101 decreases, and the output voltage of the operational amplifier 101 decreases. Thus, the nMOS transistor 102 has the reduced gate potential and the reduced drain current. As a result, the voltage (V−) decreases. Therefore, the voltage drop amount (V−) is converged to the same value as in the reference voltage Vref. When the voltage drop amount (V−) is equal to the reference voltage Vref, a predetermined positive voltage is output from the operational amplifier 101. Then, the nMOS transistors 102 and 103 are turned on. Here, the current Io flowing through the nMOS transistor 102 and resister 104 is expressed by:

$$Io = Vref/R \quad (2)$$

where R is the resistance value of the resister 104.

Since the gate voltages of the nMOS transistors 102 and 103 are equal, the nMOS transistor 103 is also turned on.

Next, the capacitance adjusting circuit 100 performs a discharging operation. In this discharging operation, the control circuit 111 opens the first switch 105 and closes the second and third switches 107 and 109 first (see FIG. 6). By closing the second switch 107, both ends of the variable capacitor 106 is conducted to the ground line GND. Therefore, the charges integrated in the variable capacitor 106 are discharged to the ground line GND. By closing the third switch 109, the drain of the nMOS transistor 103 is conducted to the ground line GND through the load 110. Therefore, the charges stored in the parasitic capacitor between the gate and drain of the nMOS transistor 103 are released to the ground line GND. Here, since the nMOS transistor 103 is on, the current supplied from the power source line VDD is also released to the ground line GND. The load 110 is provided for suppressing the current from the nMOS transistor 103.

Then, the capacitance adjusting circuit 100 performs a charging operation. In the charging operation, the control circuit 111 controls the switches 202-1 to 202-5 (see FIG. 2) first and sets the capacitance Cv of the variable capacitor 106 to the maximum value. Furthermore, the control circuit 111 closes the first switch 105 and opens the second and third switches 107 and 109. Thus, when one end of the variable capacitor 106 is disconnected from the ground line GND, the drain of the nMOS transistor 103 is disconnected from the ground line GND. Here, the nMOS transistor 103 is on. Therefore, a current Im is supplied from the power source line VDD to the variable capacitor 106 through the nMOS transistor 103. Thus, charges are stored in the variable capacitor 106, and the terminal voltage Vc (see FIG. 1) raises. The voltage Vc is expressed by $$Vc = (Im/Cv) \times \Delta t \quad (3)$$

where Δt is an integral time (that is, time for storing charges in the variable capacitor 106). As expressed by EQ 3, the larger the capacitance of the variable capacitor 106 is, the smaller the voltage Vc is.

The operational amplifier 108 outputs the low level when the voltage Vc is smaller than the reference voltage. On the other hand, the operational amplifier 108 outputs the high level when the voltage Vc is larger than the reference voltage. The control circuit 111 stores the voltage Vs output by the operational amplifier 108 after the time Δt has passed.

Next, a second discharging operation is performed. The control circuit 111 opens the first switch 105 and closes the second and third switches 107 and 109 again. Thus, the charges stored in the variable capacitor 106 and the charges stored in the parasitic capacitor between the gate and drain of the nMOS transistor 103 are discharged to the ground line GND.

Then, a second charging operation is performed. The control circuit 111 controls the switches 202-1 to 202-5 and changes the capacitance Vc of the variable capacitor 106 into one-stage-lower value. After that, the control circuit 111 closes the first switch 105 and opens the second and third switches 107 and 109. Thus, charges are stored in the variable capacitor 106 and the terminal voltage Vc (see FIG. 1) raises. The voltage Vc at that time is higher than the value when the capacitance of the variable capacitor 106 is the maximum. After the time Δt has passed, the control circuit 111 stores the voltage Vs output by the operational amplifier 108.

Then, the discharging operation and charging operation as described above are repeated until the capacitance Cv of the variable capacitor 106 reaches to the lower limit value.

When the discharging and charging operations end, the control circuit 111 compares output values of the operational amplifier 108 with each other. As shown in FIG. 6, when the output voltage Vs of the operational amplifier 108 varies from the low level to the high level at the $n^{th}$ measurement, (that is, when Vc>Vref at the $n^{th}$ measurement for the first time), the terminal voltage Vc at the $n-1^{th}$ or nth measurement is the closest to the reference voltage Vref. Here, in this specific example, by substituting the designed value of the capacitance Cv for EQ3, the reference voltage Vref is determined. In other words, when the capacitance Cv is equal to the designed value, the terminal voltage Vc completely agrees with the reference voltage Vref.

In this specific example, the capacitance Cv at the $n^{th}$ measurement is handled as the optimal value. However, the capacitance Cv at the $n-1^{th}$ measurement may be handled as the optimal value.

The control circuit 111 outputs open/close control information of the switch 202-1 to 202-5 at the $n^{th}$ measurement as switch control signals. The switch control circuit 503 (see FIG. 5) inputs this switch control signals. The switch control circuit 503 controls the opening/closing of the switches 502-1 to 502-5 in accordance with the switch control signals.

As described above, the capacitance adjusting circuit 100 and the RC filter circuit 400 are provided within the same semiconductor chip. Therefore, the magnitude of the production variations of the variable capacitors 106 and 403 are expected to be substantially equal. In addition, the production variations of the resisters 104 and 402 are expected to be substantially equal. Thus, according to the specific example, the variable capacitor 403 is adjusted in accordance with the adjustment result by the variable capacitor 106 so that the cut-off frequency Fc of the RC filter circuit 400 can be adjusted with high precision.

Figure 7:
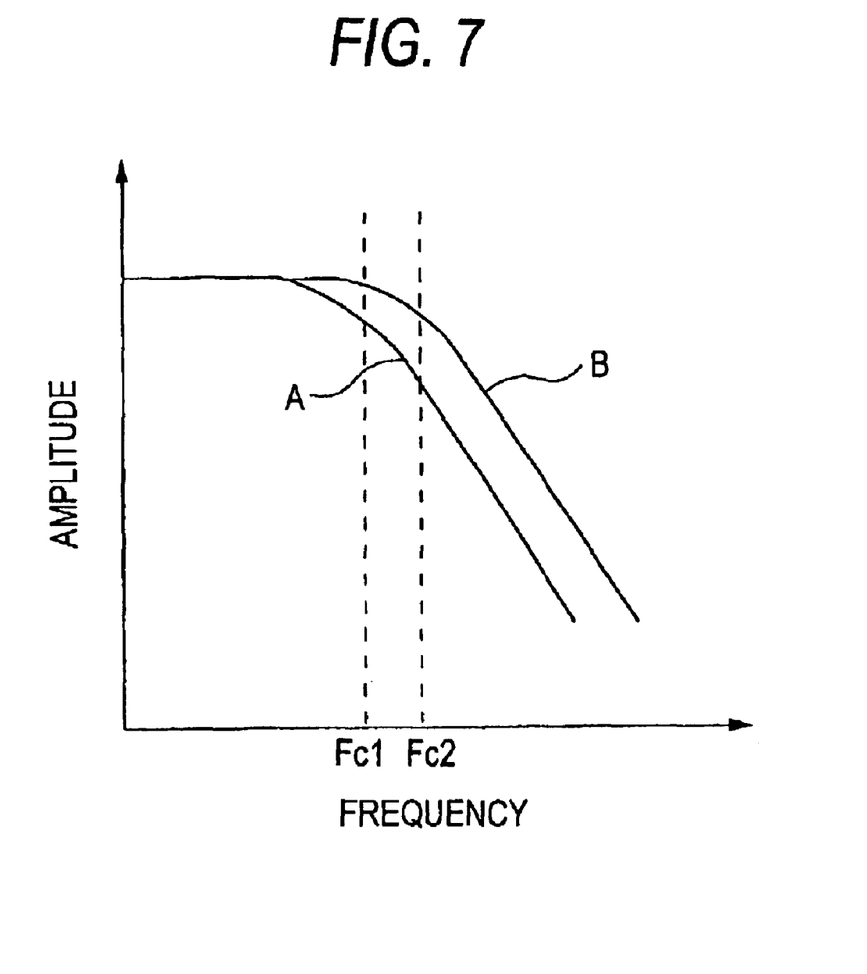
FIG. 7 is a graph showing a characteristic of the RC filter circuit shown in FIG. 4.

FIG. 7 is a diagram showing frequency characteristics of the RC filter circuit 400. In FIG. 7, the vertical axis indicates amplitudes while the horizontal axis indicates frequencies.

In FIG. 7, curves A and B are frequency characteristics of the RC filter circuit 400. The curves A and B are different in capacitance of the variable capacitor 403. The cut-off frequency Fc1 corresponds to the curve A while the cut-off frequency Fc2 corresponds to the curve B.

As shown in FIG. 7, the opening/closing of the switches 502-1 to 502-5 (see FIG. 5) are controlled so as to adjust the capacitances of the variable capacitor 403. Thus, the desired cut-off frequency Fc can be obtained.

In this specific example, the switch 109 and the load 110 are provided. Therefore, the parasitic capacitor between the gate and drain of the nMOS transistor 103 can be discharged. Thus, the increase in the terminal voltage Vc of the variable capacitor 106 due to the charges stored in the parasitic capacitor can be prevented. As a result, according to this specific example, the cut-off frequency Fc of the RC filter circuit 400 can be adjusted with high precision.

According to this specific example, the parasitic capacitor between the gate and drain of the nMOS transistor 103 are discharged at the same time as the discharging of the variable capacitor 106. However, the parasitic capacitor and the variable capacitor 106 may be discharged separately. Furthermore, the discharging time do not have to be the same. In other words, the discharging time may be determined such that these capacitors can be discharged completely and independently.

What is claimed is:

1. A capacitance adjusting circuit, comprising:
   a first operational amplifier for inputting a reference voltage from one input terminal;
   a first transistor having one main electrode connected to a first power source line, the other main electrode connected to the other input terminal of the first operational amplifier and a control electrode connected to an output terminal of the first operational amplifier;
   a second transistor having one main electrode connected to the first power source line, and a control electrode connected to the output terminal of the first operational amplifier;
   a resistor having one end connected to the other main electrode of the first transistor and the other end connected to a second power source line;
   a first switch having one end connected to the other main electrode of the second transistor;
   a variable capacitor having one end connected to the other end of the first switch and the other end connected to the second power source line;
   a second switch having one end connected to the one end of the variable capacitor and the other end connected to the second power source line;
   a second operational amplifier having one input terminal connected to the one end of the variable capacitor and the other input terminal from which the reference voltage is input;
   a third switch having one end connected to the other main electrode of the second transistor;
   a load having one end connected to the other end of the third switch and the other end connected to the second power source line; and
   a control circuit for controlling the opening and closing of the first to third switches and for storing outputs of the second operational amplifier sequentially.

2. A capacitance adjusting circuit according to claim 1, wherein the control circuit performs, for each set value of the variable capacitor:
   a first control for discharging charges stored in the variable capacitance to the second power source line by closing the second switch and by opening the first switch;
   a second control for discharging charges stored in a parasitic capacitor between the other main electrode and control electrode of the second transistor by closing the third switch and by opening the first switch; and
   a third control for storing charges in the variable capacitor by closing the first switch and by opening the second and third switches and for storing an output voltage of the second operational amplifier at that time.

3. A capacitance adjusting circuit according to claim 1, wherein the load is a resister.

4. A capacitance adjusting circuit according to claim 1, wherein the load is a transistor in a diode connection.

5. A capacitance adjusting circuit according to claim 1, wherein the load is a diode.

6. A capacitance adjusting circuit according to claim 1, wherein the first and second transistors are nMOS transistors.

* * * * *